United States Patent [19]

Morita

[11] Patent Number: 5,287,325
[45] Date of Patent: Feb. 15, 1994

[54] SEMICONDUCTOR MEMORY DEVICE HAVING A DRIVER UNIT FOR BOOSTING A WORD LINE TWICE

[75] Inventor: Yasukazu Morita, Tokyo, Japan

[73] Assignee: NEC Corporation, Tokyo, Japan

[21] Appl. No.: 712,751

[22] Filed: Jun. 10, 1991

[30] Foreign Application Priority Data

Jun. 8, 1990 [JP] Japan .................................. 2-151287

[51] Int. Cl.$^5$ ............................................. G11C 07/00
[52] U.S. Cl. ............................ 365/230.06; 365/230.01; 365/230.03; 365/189.01
[58] Field of Search ...................... 365/230.06, 230.01, 365/230.03, 189.01

[56] References Cited

U.S. PATENT DOCUMENTS

| | | | |
|---|---|---|---|
| 4,503,522 | 3/1985 | Etoh et al. ........................... | 365/203 |
| 4,649,523 | 3/1987 | Holder, Jr. et al. ................. | 365/203 |
| 4,896,297 | 1/1990 | Miyatake et al. ................... | 365/230.06 |
| 5,056,062 | 10/1991 | Kuwabara et al. ............. | 365/230.06 |
| 5,119,334 | 6/1992 | Fujii ................................. | 365/230.06 |

FOREIGN PATENT DOCUMENTS 0389202 9/1990 European Pat. Off. .
57-18080 1/1982 Japan .
WO8604726 8/1986 PCT Int'l Appl. .

OTHER PUBLICATIONS

Patent abstracts of Japan, vol. 6, No. 82, May 20, 1982.

Primary Examiner—William L. Sikes
Assistant Examiner—Scott A. Ouellette
Attorney, Agent, or Firm—Sughrue, Mion, Zinn, Macpeak & Seas

[57] ABSTRACT

When accessing a data bit memorized in a memory cell of a memory cell array incorporated in a dynamic random access memory device, a word line driving unit boosts one of the word lines coupled to the accessed memory cell over a power voltage level for allowing electric charges stored in the memory cell to be read out from the bit line pair, lowers the selected word line, and, then, boosts again after difference amplification so that the extremely thin gate oxide of the switching transistor forming a part of the accessed memory cell is hardly damaged by the extremely high voltage level.

8 Claims, 8 Drawing Sheets

SEMICONDUCTOR MEMORY DEVICE HAVING A DRIVER UNIT FOR BOOSTING A WORD LINE TWICE

FIELD OF THE INVENTION

This invention relates to a semiconductor memory device and, more particularly, to a word line driver unit incorporated in a random access memory device for boosting one of the word lines over a power voltage level.

DESCRIPTION OF THE RELATED ART

A typical example of the random access memory device is illustrated in FIG. 1. The prior art random access memory device comprises a memory cell array 1 associated with a plurality of bit line pairs BLP1 to BLPn as well as a plurality of word lines W1 to Wm, a plurality of sense amplifier circuits SA1 to SAn respectively coupled to the bit line pairs BLP1 to BLPn, a row address buffer/decoding unit 2 responsive to row address bits, a word line driving unit 3 for boosting one of the word lines W1 to Wm over a power voltage level Vcc, a sense amplifier driving unit 4 for activating the sense amplifier circuits SA1 to SAn, and a timing generating unit 5 for sequentially controlling peripheral units such as the word line driving unit 3 and the sense amplifier driving unit 4.

The memory cell array 1 is fabricated from a plurality of memory cells M11, M1n, Mm1 and Mmn arranged in rows and columns, and each of the memory cells M11 to Mmn is implemented by a series combination of an n channel type switching transistor Qn1 and a storage capacitor CP1 coupled between an associated bit line and a reference voltage source REF. Row address bits are supplied to the row address buffer/decoding unit 2 and latched in the presence of a row address strobe signal RAS of an active low voltage level. The row address buffer/decoding unit 2 decodes the row address bits so that the word line driving unit 3 boosts one of the word lines W1 to Wm over the power voltage level Vcc. The timing generating unit 5 is responsive to the row address strobe signal RAS and other external controlling signals, and sequentially produces various timing signals fed to the peripheral circuits as described hereinbelow.

Each of the sense amplifier circuits SA1 to SAn is implemented by two series combinations of n-channel type field effect transistors Qn2 and Qn3 and p-channel type field effect transistors Qp1 and Qp2, and the two series combinations are coupled between two power voltage lines PL1 and PL2. The common drain node DN1 or DN2 of one of the two series combinations is coupled to the gate electrodes of the other series combination, and the common drain nodes DN1 and DN2 are coupled to the associated bit line pairs BLP1 or BLPn. The two power voltage lines PL1 and PL2 are driven by the sense amplifier driving unit 4 under the control of the timing generating unit 5, and the sense amplifier circuits SA1 to SAn increase small differences on the associated bit line pairs upon drive of the power voltage lines PL1 and PL2.

Although the memory cell array 1 is further associated with other peripheral units such as a precharging circuit coupled to the bit line pairs BLP1 to BLPn, they are not shown in the drawings, because they do not directly concern a problem inherent in the prior art random access memory device.

Turning to FIG. 2 of the drawings, a part of the word line driving unit 3 is shown together with one of the word lines W1, and largely comprises a bootstrapping circuit 300, a selecting circuit 310 for coupling a common node CN1 to one of the bootstrapping circuit 300 and a ground voltage line GND, and a plurality of transfer circuits 30l to 30m respectively assigned the word lines W1 to Wm and coupled to the common node CN1. However, only one transfer circuit 321 is shown in FIG. 2 for the sake of simplicity.

The bootstrapping circuit 300 is responsive to a control signal F1 fed from the timing generating unit 5 and comprises a series of inverting circuits INV1, INV2, INV3 and INV4 supplied with the controlling signal F1, a bootstrapping capacitor CP2 coupled between the inverting circuit INV4 and a booting node BN1, and a p-channel type field effect transistor Qp3 coupled between a source of power voltage Vcc and the booting node BN1. Before a bootstrapping operation, the booting node BN1 is kept at a certain voltage level approximately equal to the power voltage level Vcc. When the controlling signal F1 reaches the bootstrapping capacitor CP2 through the inverting circuits INV1 to INV4, the booting node BN1 is boosted over the power voltage level Vcc.

The selecting circuit 310 comprises a switching circuit SW1 coupled between the booting node BN1 and the ground voltage line GND for selectively providing a conduction path from the booting node BN1 and the ground voltage line GND to the common node CN1, and another bootstrapping circuit 310a for allowing the boosted voltage level at the booting node BN1 to reach the common node CN1. The switching circuit SW1 is implemented by a series combination of a p-channel type field effect transistor Qp4 and an n-channel type field effect transistor Qn4, and the common drain node between the field effect transistors Qp4 and Qn4 serves as the common node CN1.

The bootstrapping circuit 310a comprises a series combination of a p-channel type field effect transistor Qp5 and an n-channel type field effect transistor Qn5 coupled between the booting node BN1 and the ground voltage line GND, a bootstrapping capacitor CP3 coupled between the common drain node of the field effect transistors Qp5 and Qn5 and the gate electrode GE3 of the p-channel type field effect transistor Qp4, a p-channel type field effect transistor Qp6 coupled between the bootstrapping capacitor CP3 and a series of inverting circuits INV6 and INV7, a p-channel type field effect transistor Qp7 coupled to the gate electrode of the p-channel type field effect transistor Qp6, and two series combination of p-channel type field effect transistors Qp8 and Qp9 and n-channel type field effect transistors Qn6 and Qn7 coupled in cascade between the inverting circuit INV7 and both of the source/drain node of the p-channel type field effect transistor Qp7 and the gate electrodes GE4 of the n-channel type field effect transistors Qn4 and Qn5. The two series combinations coupled in cascade are responsive to a precharging signal P1 and the complementary precharging signal P2 fed from the timing generating unit 5, and the common drain node DN3 controls the p-channel type field effect transistor Qp6 and the n-channel type field effect transistors Qn4 and Qn5. The bootstrapping capacitor CP3 increases the voltage level at the gate electrode of the p-channel type field effect transistor Qp4 by the agency of the boosted voltage level fed through the p-channel type field effect transistor Qp5, thereby allowing the boosted voltage level to be propagated to the common node CN1.

All of the transfer circuits 32*l* to 32*m* are similar in circuit arrangement, and each of the transfer circuits 32*l* to 32*m* comprises a series combination of a p-channel type field effect transistor Qp10 and an n-channel type field effect transistor Qn8 coupled between the common node CN1 and the ground voltage line GND, and a series combination of an inverting circuit INV8 and a p-channel type field effect transistor Qp11 coupled between the row address buffer/decoding unit 2 and the gate electrode GE1 of the p-channel type field effect transistor Qp10, and the gate electrode GE2 of the n-channel type field effect transistor Qn8 is directly coupled to the row address buffer/decoding unit 2. The transfer circuit 32*l* propagates the boosted voltage level to the associated word line W1 upon selection by the row address buffer/decoding unit 2, and keeps the word line W1 at the ground voltage level if another word line is designated.

Description is made on the circuit behavior with reference to FIG. 3 of the drawings on the assumption that a data bit of logic "1" level stored in the memory cell M1n is accessed. The data bit of logic "1" level slightly lifts the bit line of the associated bit line pair, because electric charge flows from the storage capacitor through the switching transistor Qn1 to the bit line. If the row address strobe signal goes down to the active low voltage level at time t1, the row address bits indicative of the word line W1 is latched by the row address buffer/deciding unit 2, and the timing generating unit 5 shifts the precharging signal P1 to the low voltage level and, accordingly, the complementary signal P2 to the high voltage level Vcc at time t2. The precharging signal P1 of the high voltage level allows the n-channel type field effect transistor Qn6 to turn off, and the complementary signal P2 causes the p-channel type field effect transistor Qp9 to turn off. Since the controlling signal F1 remains low, the p-channel type field effect transistor Qp8 supplies the power voltage level Vcc to the gate electrode of the n-channel type field effect transistor Qn7, and the n-channel type field effect transistor Qn7 turn on. Then, a current path is provided between the common drain node DN3 of the field effect transistors Qp9 and Qn7 and the ground voltage line GND, and the n-channel type field effect transistors Qn4 and Qn5 turn off so that the common node CN1 and the bootstrapping capacitor CP3 are isolated from the ground voltage line GND.

At time t3, the row address bits are decoded by the row address buffer/decoding unit 2, and the gate electrodes GE1 and GE2 go up to the power voltage level and down to the ground voltage level, respectively. Then, the n-channel type field effect transistor Qn8 turns off, and the word line W1 is isolated from the ground voltage line GND. However, the p-channel type field effect transistor Qp10 remains off.

The timing generating unit 5 shifts the controlling signal F1 to the high voltage level at time t4, and the inverting circuit INV7 supplies the power voltage level through the p-channel type field effect transistor Qp6 to the bootstrapping capacitor CP3 and, accordingly, to the gate electrode GE3 at time t5. Then, the bootstrapping capacitor CP3 is charged up.

At time t6 immediately after time t5, the inverting circuit INV4 supplies the power voltage level to the bootstrapping capacitor CP2. Since the booting node BN1 has been already charged by the p-channel type field effect transistor Qp3, the bootstrapping capacitor CP2 causes the booting node BN1 to go up over the power voltage level Vcc. The p-channel type field effect transistor Qp5 transfers the boosted voltage level at the booting node BN1 to the bootstrapping capacitor CP3, and the voltage level at the gate electrode GE3 is boosted over the power voltage level Vcc. Then, the boosted voltage level passes through the p-channel type field effect transistor Qp4, and allows the common node CN1 to go up over the power voltage level. Self-bootstrapping phenomenon takes place in the p-channel type field effect transistor Qp10 due to capacitance between the source and the gate slightly overlapped with each other, and the boosted voltage level at the common node CN1 is transferred to the word line W1.

The word line W1 thus driven to the boosted voltage level allows the memory cells M11 to M1n to turn on, and the data bits memorized therein are read out to the associated bit line pairs BLP1 to BLPn. A small difference in voltage level on the bit line pair BLPn is indicative of the data bit read out from the memory cell M1n, and the timing generating unit 5 causes the sense amplifier driving unit 4 to drive the power voltage lines PL1 and PL2 from an intermediate voltage level Vcc/2 to the power voltage level Vcc and the ground voltage level, respectively. Then, the sense amplifier circuit SAn is activated and increases the magnitude of the difference voltage level on the bit line pair BLPn.

Though not shown in the drawings, the large difference on the bit line pair BLPn is transferred through a data line pair to an output buffer circuit, and the output buffer circuit produces an output data signal indicative of the data bit read out from the memory cell M1n.

The row address strobe signal RAS is recovered to the inactive high voltage level at time t8, and the timing generating unit 5 shifts the controlling signal F1 to the low voltage level at time t9. The timing generating unit 5 further shifts the precharging signal P1 to the high voltage level and, accordingly, the complementary signal P2 to the low voltage level at time t10. The inverting circuit INV4 lowers the voltage level at the booting node BN1 through the bootstrapping capacitor CP2, and the booting node BN1 also lowers the voltage level at the gate electrode GE3 through the bootstrapping capacitor CP3. The precharging signal P1 of the high voltage level causes the n-channel type field effect transistor Qn6 to turn on, and the complementary signal P2 of the low voltage level also causes the p-channel type field effect transistor Qp9 to turn on. The n-channel type field effect transistor Qn6 in the on-state supplies the ground voltage level to the gate electrode of the n-channel type field effect transistor Qn7, and allows the n-channel type field effect transistor Qn7 to turn off. Then, the power voltage level Vcc is supplied to the common drain node DN3 and, accordingly, to the gate electrodes GE4 of the n-channel type field effect transistors Qn4 and Qn5. This results in that the n-channel type field effect transistors Qn4 and Qn5 to turn on. The common drain node CN1 is coupled through the n-channel type field effect transistor Qn4 to the ground voltage line GND, and the n-channel type field effect transistor Qn5 in the on-state causes the gate electrode GE3 to be recovered to the initial voltage level. The voltage level at the common node CN1 is decayed, and the gate electrode GE1 and the word line W1 is decreased. Upon decrease of the voltage level on the word line W1, the memory cells M11 to M1n are isolated from the associated bit line pairs BLP1 to BLPn.

At time t11, the timing generating unit 5 causes the sense amplifier driving unit 4 to equalize the power voltage lines PL1 and PL2 at the intermediate voltage level Vcc/2, and each of the bit line pairs BLP1 to BLPn is balanced with each other.

Thus, the prior art random access memory device keeps the selected word line W1 at the boosted voltage level until the difference voltages on the bit line pairs BLP1 to BLPn are sufficiently developed, i.e. from time t1 to time t10. Such a boosted voltage level on the selected word line is desirable for a data bit of logic "1" level, because a highly conductive channel takes place in the n-channel type switching transistor Qn1. However, if a memory cell stores a data bit of logic "0" level, a large difference voltage level is applied to an extremely thin gate insulating film of the n-channel type switching transistor Qn1, and the extremely thin gate insulating film tends to be damaged by the boosted voltage level.

SUMMARY OF THE INVENTION

It is therefore an important object of the present invention to provide a semiconductor memory device which is free from the problem inherent in the prior art semiconductor memory device.

To accomplish the object, the present invention proposes to boost a selected word line twice in a single access and to recover the selected word line to a relatively low voltage level between the two boosting phases.

In accordance with the present invention, there is provided a semiconductor memory device fabricated on a single semiconductor chip, comprising: a) a plurality of memory cells arranged in rows and columns and respectively storing data bits in the form of electric charges, the plurality of memory cells having switching transistors, respectively; b) a plurality of word lines respectively associated with the rows of the memory cells and coupled to the gate electrodes of the switching transistors of the associated rows of the memory cells; c) a row selecting unit responsive to a row address strobe signal and operative to decode row address bits for designating one of the word lines; d) a plurality of bit line pairs respectively associated with the columns of the memory cells for propagating the data bits read out from the memory cells coupled to the aforesaid one of the word lines; and e) word line driving means driving the aforesaid one of the word lines for allowing the data bits to be read out from the memory cells coupled to the aforesaid one of the word lines through the switching transistors to the bit line pairs, the word line driving means boosting the aforesaid one of the word lines to a first voltage level widely spaced from a threshold level of the switching transistors in a first phase of a read-out operation, the word line driving means shifting the aforesaid one of the word lines to a second voltage level closer to the threshold level than the first voltage level in a second phase following the first phase, the word line driving means boosting the aforesaid one of the word lines to a third voltage level widely spaced from the threshold level rather than the second voltage level in a third phase following the second phase.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 4:
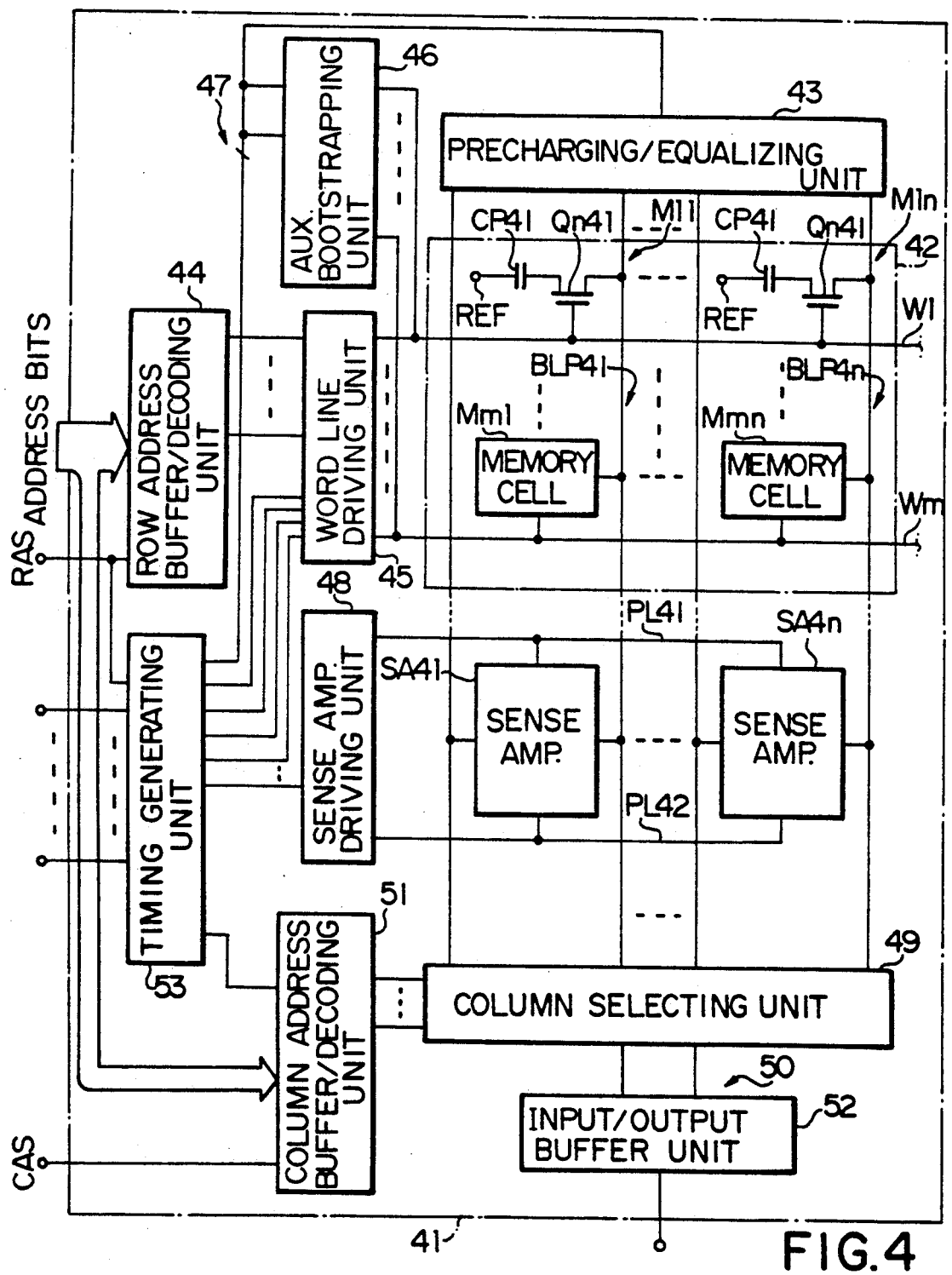
FIG. 4 is a block diagram showing the arrangement of a random access memory device according to the present invention.

Referring to FIG. 4 of the drawings, a random access memory device embodying the present invention is fabricated on a single semiconductor chip 41, and largely comprises a memory cell array 42 and peripheral units. The memory cell array 41 is fabricated from a plurality of memory cells M11, M1n, Mm1 and Mmn arranged in rows and columns, and each of the memory cells M11 to Mmn is implemented by an n-channel type switching transistor Qn41 and a storage capacitor CP41 coupled in series. A plurality of bit line pairs BLP41 to BLP4n are respectively associated with the columns of the memory cells M11 to Mmn, and either component bit line of each bit line pair is coupled to the drain nodes of the n-channel type switching transistors Qn41 in the associated column. A reference voltage source REF is shared between the storage capacitors CP41, and a data bit is memorized in each of the memory cells M11 to Mmn in the form of electric charges.

A plurality of word lines W1 to Wm are coupled to the gate electrodes of the n-channel type switching transistors Qn41 of the respective rows, and the word lines W1 to Wm are selectively boosted over a power voltage level Vcc twice in a single read-out mode of operation.

Various peripheral units are provided in the random access memory device. Namely, a precharging/equalizing unit 43 is coupled to the bit line pairs BLP41 to BLP4n, and is operative to equalize the bit line pairs BLP41 to BLP4n at an intermediate voltage level Vcc/2. A row address buffer/decoding unit 44 is supplied with row address bits in the presence of a row address strobe signal RAS of an active low voltage level, and a word line driving unit 45 selectively drives the word lines W1 to Wm under the supervision of the row address buffer/decoding unit 44. When one of the word lines W1 to Wm is driven to a first voltage level Vh1 over the power voltage level Vcc, the n-channel type switching transistors Qn41 coupled thereto concurrently turn on, and data bits read out from the memory cells produce small differential voltages on the associated bit line pairs BLP41 to BLP4n, respectively. In this instance, the word lines W1 to Wm are further coupled to an auxiliary bootstrapping unit 46, and the word line driving unit 45 and the auxiliary bootstrapping unit 46 as a whole constitute word line driving means 47.

Figure 1:
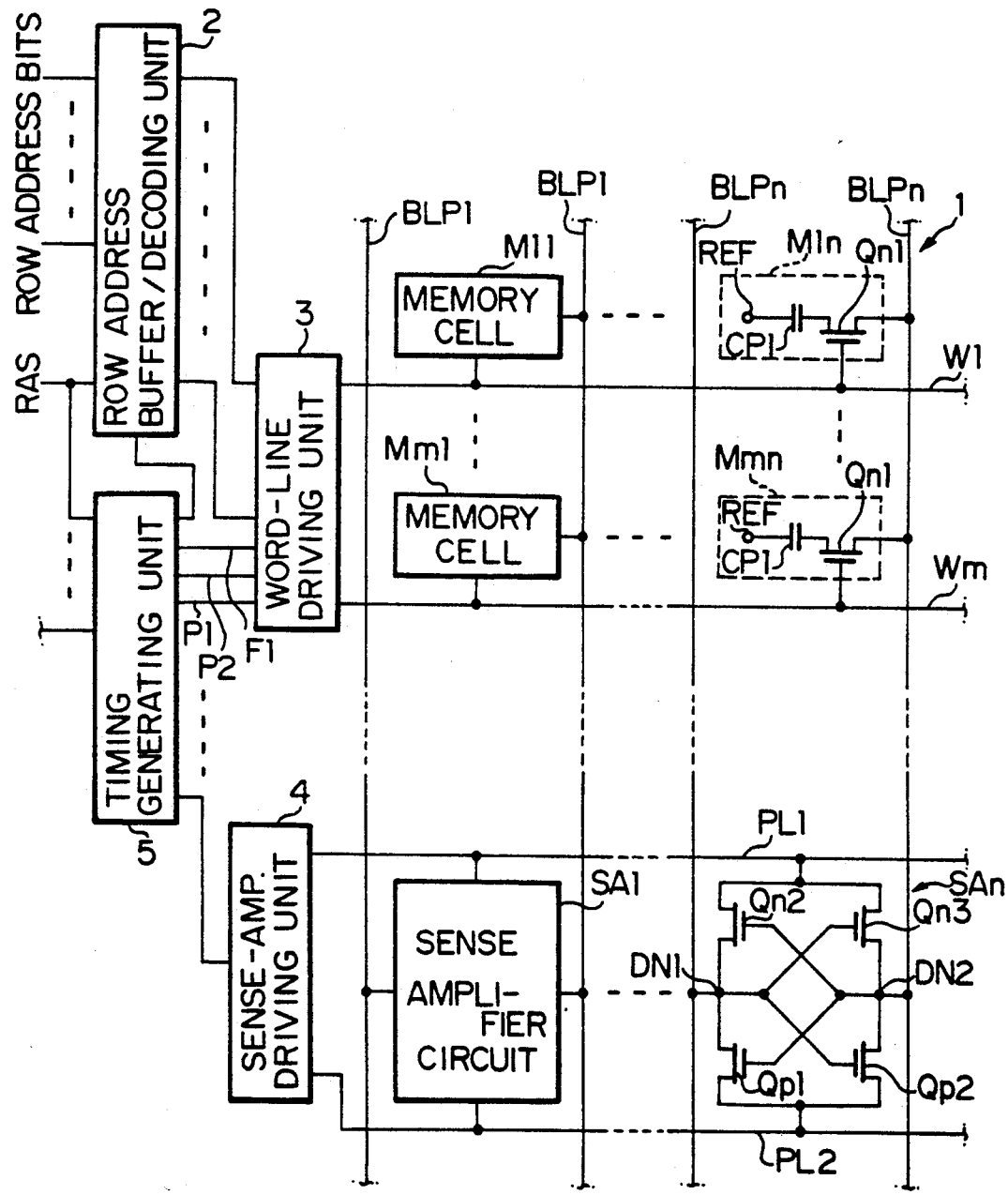
FIG. 1 is a diagram showing the arrangement of the prior art random access memory device.

The bit line pairs BLP41 to BLP4n are respectively coupled to a plurality of sense amplifier circuits SA41 to SA4n, and the sense amplifier circuits SA41 to SA4n are coupled through a pair of power voltage lines PL41 and PL42 to a sense amplifier driving unit 48. The sense amplifier driving unit 48 drives the power voltage lines PL41 and PL42 to the power voltage level Vcc and the ground voltage level, respectively, and the sense amplifier circuits SA41 to SA4n are activated for increasing small differential voltages on the associated bit line pairs BLP41 to BLP4n. The circuit arrangement of the sense amplifier circuits SA41 to SA4n is similar to the sense amplifier circuit shown in FIG. 1, and, for this reason, no further description is incorporated hereinbelow.

The bit line pairs BLP41 to BLP4n are terminated at a column selecting unit 49, and the column selecting unit 49 interconnects one of the bit line pairs BLP41 to BLP4n and a data line pair 50 under the control of a column address buffer/decoding unit 51. Namely, the column address buffer/decoding unit 51 decodes column address bits and instructs the column selecting unit 49 to provide a data path between one of the bit line pairs BLP41 to BLP4n designated by the column address bits and the data bit pair 50. The data line pair 50 propagates one of the data bits to an input/output buffer unit 52, and the input/output buffer unit 52 produces an output data signal indicative of the data bit read out from the memory cell designated by the row and column address bits.

The random access memory device selectively enters a write-in mode and a read-out mode of operation, and the peripheral units are sequentially controlled by a timing generating unit 53. The timing generating unit 53 is responsive to external controlling signals, and sequentially distributes internal controlling signals to the peripheral units.

Figure 5:
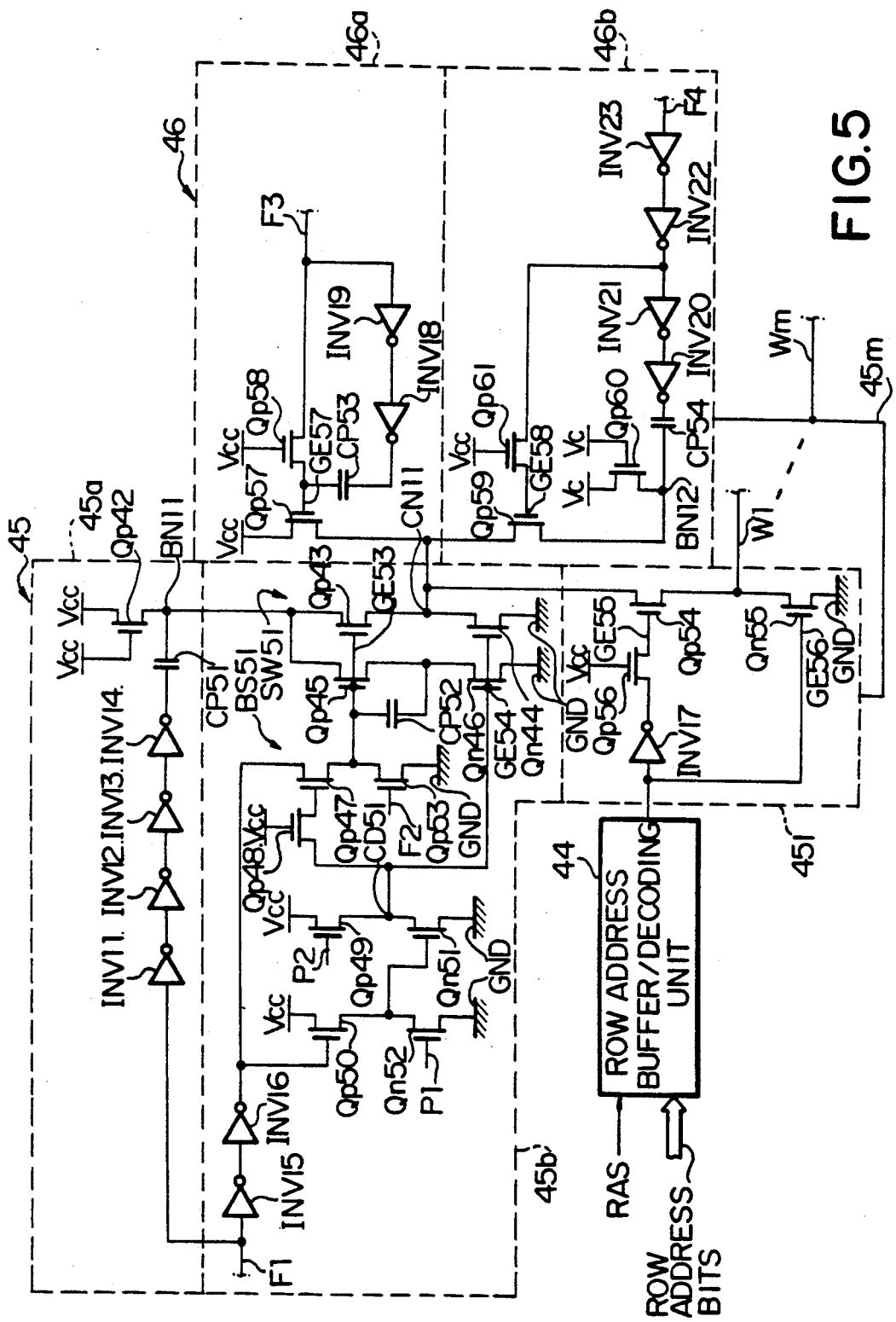
FIG. 5 is a circuit diagram showing the circuit arrangement of a word line driving unit incorporated in the random access memory device shown in FIG. 4.

Turning to FIG. 5 of the drawings, the word line driving unit 45 largely comprises a main bootstrapping circuit 45a, a selecting circuit 45b for coupling a common node CN11 to one of the main bootstrapping circuit 45a and a ground voltage line GND, and a plurality of transfer circuits 45l to 45m respectively assigned the word lines W1 to Wm and coupled to the common node CN11. However, only one transfer circuit 45l is shown in FIG. 5 for the sake of simplicity.

The main bootstrapping circuit 300 is responsive to an internal control signal F1 fed from the timing generating unit 53, and comprises a series of inverting circuits INV11, INV12, INV13 and INV14 supplied with the internal controlling signal F1, a bootstrapping capacitor CP51 coupled between the inverting circuit INV14 and a booting node BN11, and a p-channel type field effect transistor Qp42 coupled between a source of power voltage Vcc and the booting node BN11. Before a bootstrapping operation, the booting node BN11 is kept at a certain voltage level approximately equal to the power voltage level Vcc. When the controlling signal F1 reaches the bootstrapping capacitor CP51 through the inverting circuits INV11 to INV14, the booting node BN1 is boosted over the power voltage level Vcc. In this instance, the main bootstrapping circuit 45a boosts the booting node BN11 to the first voltage level Vh1 widely spaced from the threshold voltage level of the n-channel type switching transistors Qn41. The inverting circuits INV11 to INV14 form in combination a delay circuit.

The selecting circuit 45b comprises a switching circuit SW51 coupled between the booting node BN11 and the ground voltage line GND for selectively providing a conduction path from the booting node BN11 and the ground voltage line GND to the common node CN11, and another bootstrapping circuit BS51 for allowing the first voltage level Vh1 to reach the common node CN1. The switching circuit SW51 is implemented by a series combination of a p-channel type field effect transistor Qp43 and an n-channel type field effect transistor Qn44, and the common drain node between the field effect transistors Qp43 and Qn44 serves as the common node CN11.

The bootstrapping circuit BS51 is provided for the gate electrode of the p-channel type field effect transistor Qp43, and comprises a series combination of a p-channel type field effect transistor Qp45 and an n-channel type field effect transistor Qn46 coupled between the booting node BN11 and the ground voltage line GND, a bootstrapping capacitor CP52 coupled between the common drain node of the field effect transistors Qp45 and Qn46 and the gate electrode GE53 of the p-channel type field effect transistor Qp43, a p-channel type field effect transistor Qp47 coupled between the bootstrapping capacitor CP52 and a series of inverting circuits INV15 and INV16, a p-channel type field effect transistor Qp48 coupled to the gate electrode of the p-channel type field effect transistor Qp47, and two series combination of p-channel type field effect transistors Qp49 and Qp50 and n-channel type field effect transistors Qn51 and Qn52 coupled in cascade between the inverting circuit INV16 and both of the source-/drain node of the p-channel type field effect transistor Qp48 and the gate electrodes GE54 of the n-channel type field effect transistors Qn44 and Qn46. The bootstrapping capacitor CP52 is connectable to the ground voltage line GND through a p-channel type field effect transistor Qp53. The two series combinations coupled in cascade are responsive to a precharging signal P1 and the complementary precharging signal P2 fed from the timing generating unit 53, and an internal controlling signal F2 is supplied to the gate electrode of the p-channel type field effect transistor Qp53. The bootstrapping capacitor CP3 increases the voltage level at the gate electrode GE53 of the p-channel type field effect transistor Qp43 by the agency of the first voltage level Vh1 fed through the p-channel type field effect transistor Qp45, thereby allowing the first voltage level Vh1 to be propagated to the common node CN11. However, the p-channel type field effect transistor Qp53 provides a current path from the gate electrode GE53 to the ground voltage line GND in the present of the internal controlling signal F2 of the active low voltage level.

All of the transfer circuits 45l to 45m are similar in circuit arrangement, and each of the transfer circuits 45l to 45m comprises a series combination of a p-channel type field effect transistor Qp54 and an n-channel type field effect transistor Qn55 coupled between the common node CN11 and the ground voltage line GND, and a series combination of an inverting circuit INV17 and a p channel type field effect transistor Qp56 coupled between the row address buffer/decoding unit 44 and the gate electrode GE55 of the p-channel type field effect transistor Qp54, and the gate electrode GE56 of the n-channel type field effect transistor Qn55 is directly coupled to the row address buffer/decoding unit 44. When the row address buffer/ decoding unit 44 selects the word line W1, the transfer circuit 451 propagates the first voltage level Vh1 to the associated word line W1 in a first phase of operation, and the other transfer circuits keep the associated word line at the ground voltage level.

The auxiliary bootstrapping unit 46 largely comprises a discharging circuit 46a for decreasing the voltage level at the common node CN11 to a second voltage level Vh2 in a second phase of operation, and a bootstrapping circuit 46a for boosting the common node CN11 to a third voltage level Vh3 in a third phase of operation. The first phase is followed by the second phase which in turn is followed by the third phase. The second voltage level Vh2 is closer to the threshold level of the n-channel type switching transistors Qn41, and the third voltage level Vh3 is widely spaced from the threshold level rather than the second voltage level Vh2. In this instance, the second voltage level Vh2 is as high as the power voltage level Vcc, and the first and third voltage levels Vh1 and Vh3 are higher than the power voltage level Vcc.

The discharging circuit 46a comprises a p-channel type field effect transistor Qp57 coupled between the source of power voltage level Vcc and the common node CN11, a bootstrapping capacitor CP53 coupled to the gate electrode GE57 of the p-channel type field effect transistor Qp57, a series combination of inverting circuits INV18 and INV19 supplied with an internal controlling signal F3, and a p-channel type field effect transistor Qp58 coupled between the anode of the inverting circuit INV19 and the gate electrode GE57. The gate electrode of the p-channel type field effect transistor Qp58 is coupled to the source of power voltage level Vcc.

The auxiliary bootstrapping circuit 46b comprises inverting circuits INV20 to INV23 coupled in series, a bootstrapping capacitor CP54 coupled between the inverting circuit INV20 and a booting node BN12, a p-channel type field effect transistor Qp59 coupled between the booting node BN12 and the common node CN11, a p-channel type field effect transistor Qp60 coupled between the source of power voltage level Vcc and the booting node BN12, and a p-channel type field effect transistor Qp61 coupled between the cathode of the inverting circuit INV22 and the gate electrode GE58 of the p-channel type field effect transistor Qp59.

Figure 6:
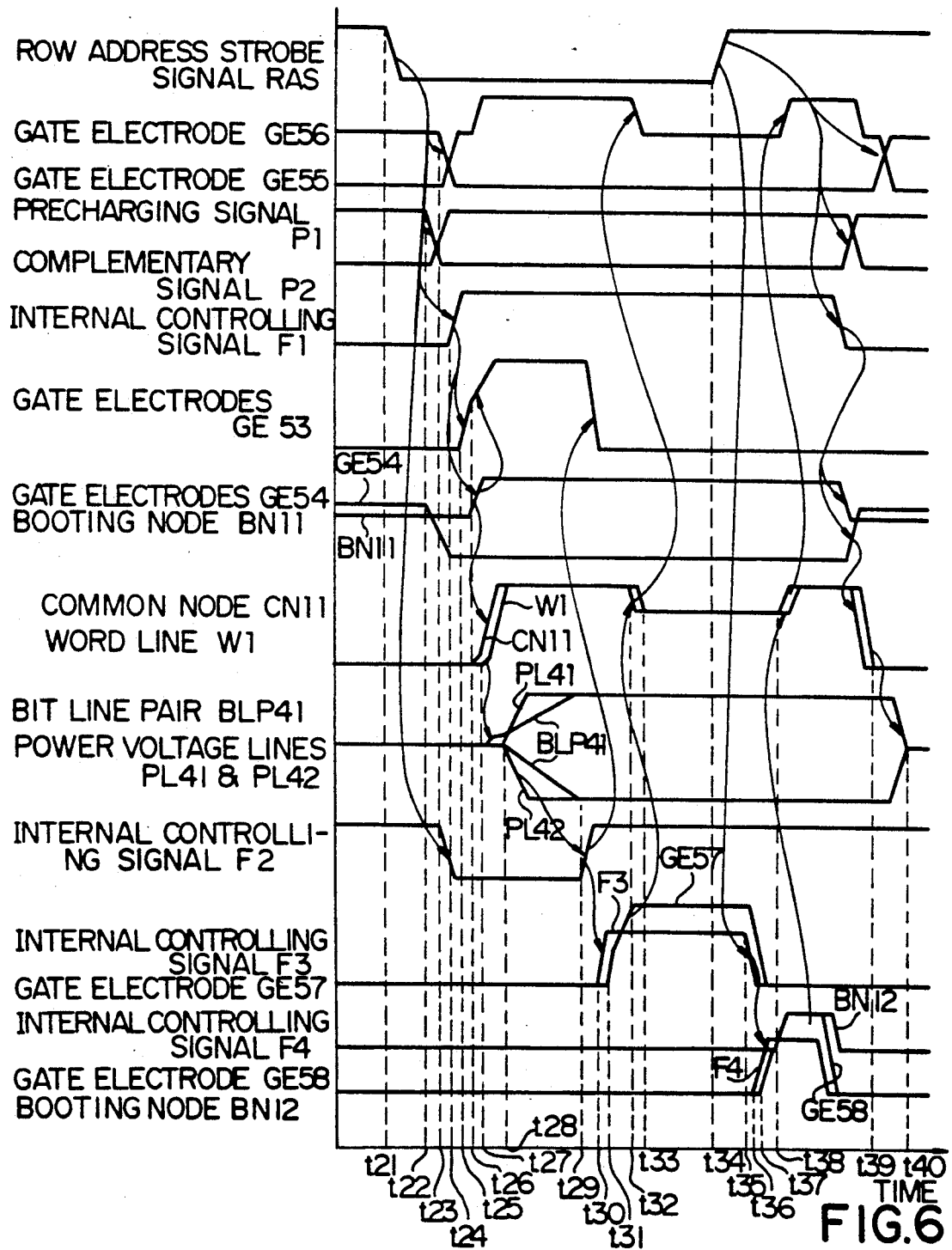
FIG. 6 is a timing chart showing the sequence of a read-out operation for the random access memory device shown in FIG. 4.

Description is hereinbelow made on the circuit behavior of the random access memory device according to the present invention with reference to FIG. 6. Assuming now that a data bit memorized in the memory cell M11 is accessed with the row and column address bits indicative of the word line W1 and the bit line pair BLP41, the row address bits are latched by the row address buffer/ decoding unit 44 upon decay of the row address strobe signal RAS at time t21. The column address bits are, thereafter, latched by the column address buffer/decoding unit 51 in the presence of a column address strobe signal CAS of the active low voltage level.

The timing generating unit 53 is also responsive to the row address strobe signal RAS, and causes the precharging signal P1 to go down to the ground voltage level at time t22. The complementary precharging signal P2 concurrently goes up to the power voltage level Vcc. The n-channel type field effect transistor Qn52 turns off, and the p-channel type field effect transistor Qp49 also turns off. Since the internal controlling signal F1 remains low, the p-channel type field effect transistor Qp50 supplies the power voltage level Vcc to the gate electrode of the n-channel type field effect transistor Qn51, the n-channel type field effect transistor Qn51 turns on, and the common drain node CD51 is grounded therethrough. With the ground voltage level at the gate electrodes GE54, the n-channel type field effect transistors Qn44 and Qn46 turn off. The internal controlling signal F2 is decayed, and the gate electrodes GE53 are grounded through the p-channel type field effect transistor Qp53.

The row address buffer/decoding unit 44 supplies the ground voltage level to the inverting circuit INV17 and the gate electrode GE56 of the n-channel type field effect transistor Qn55 at time t23. The n-channel type field effect transistor Qn55 turns off so that the word line W1 is isolated from the ground voltage line GND. The inverting circuit INV17 allows the gate electrode GE55 to go up to the power voltage level Vcc.

The timing generating unit 53 causes the internal controlling signal F1 to go up at time t24, and the p-channel type field effect transistor Qp50 turns off. The power voltage level Vcc is supplied from the inverting circuit INV16 to the gate electrodes GE53, and the voltage level at the gate electrodes GE53 are lifted up at time t25. This means that the bootstrapping capacitor CP52 is precharged.

The internal controlling signal F1 reaches the bootstrapping capacitor CP51 at time t26, and the bootstrapping capacitor CP51 boosts the booting node BN11 toward the first voltage level Vh1. The voltage level at the booting node BN11 is relayed through the p-channel type field effect transistors Qp43 and Qp45 to the common node CN11 as well as the bootstrapping capacitor CP52. The bootstrapping capacitor CP52 boosts the voltage level at the gate electrodes GE53, and, therefore, the p-channel type field effect transistor Qp43 propagates the first voltage level Vh1 to the common node CN11.

Upon increase of the voltage level at the common node CN11, self-bootstrapping phenomenon takes place at the gate electrode GE55, and the word line W1 is increased to the first voltage level Vh1 at time t27. The first voltage level Vh1 on the word line W1 allows the memory cells M11 to M1n to strongly turn on, and small differential voltages are produced on the bit line pairs BLP41 to BLP4n, respectively. The timing generating unit 53 provides an internal controlling signal to the sense amplifier driving unit 48, and the power voltage lines PL41 and PL42 are driven to the power voltage level Vcc and the ground voltage level, respectively, at time t28. The sense amplifier circuits SA41 to SA4n are activated with the power voltage lines PL41 and PL42, and the small differential voltage on the bit line pair BLP41 is sufficiently developed at time t29. The internal controlling signal F2 is recovered to the power voltage level Vcc, and the internal controlling signal F3 goes up at time t30. The gate electrode GE57 is charged with the internal controlling signal F3, and the inverting circuit INV18 causes the bootstrapping capacitor CP53 to boost the voltage level at the gate electrode GE57 at time t31. Then, the p-channel type field effect transistor Qp57 starts on discharging the common node CN11 at time t32, and the voltage level on the word line W1 follows. The common node CN11 is decreased to the second voltage level Vh2, and the word line W1 reaches the second voltage level Vh2 at time t33. Thus, the voltage level on the word line W1 is lowered after the development of the small differential voltages on the bit line pairs BLP41 to BLP4n, and the gate insulating films of the n-channel type switching transistors Qn41 are less liable to be damaged.

After the development of the differential voltages on the bit line pairs BLP41 to BLP4n, the timing generating unit 53 provides an internal controlling signal to the column address buffer/decoding unit 51, and the column address buffer/decoding unit 51 instructs the column selecting unit 49 to interconnect the bit line pair BLP41 and the data line pair 50. Then, the differential voltage sufficiently developed is relayed to the input/output buffer unit 52, and an output data signal indicative of the data bit read out from the memory cell M11 is fed to the outside of the random access memory device.

Before completion of the read-out operation, the row address strobe signal RAS goes up at time t34, and the timing generating unit 53 allows the internal timing signal F3 to be recovered at time t35. The internal controlling signal F4 is lifted at time t36, and the gate electrode GE58 starts on increasing at time t37. Since the booting node BN12 has been already charged through the p-channel type field effect transistor Qp60, the bootstrapping capacitor CP54 boosts the booting node BN12 to the third voltage level Vh3, and the p-channel type field effect transistor Qp59 propagates the third voltage level Vh3 to the common node CN11. The common node CN11 and, accordingly, the word line W1 are lifted to the third voltage level Vh3 at time t38, and the large differential voltage levels on the bit line pairs BLP41 to BLP4n charge the storage capacitors Cp41 of the memory cells M11 to M1n to at least the power voltage level Vcc.

The timing generating unit 53 allows the internal controlling signals F3 and F1, the precharging signal P1 and the complementary precharging signal P2 to sequentially recover to the respective initial levels, and the word line W1 goes down to the ground voltage level at time t39. The power voltage lines PL41 and PL42 are equalized at the intermediate voltage level Vcc/2 at time t40, and the random access memory device becomes ready for the next access.

Second Embodiment

Figure 7:
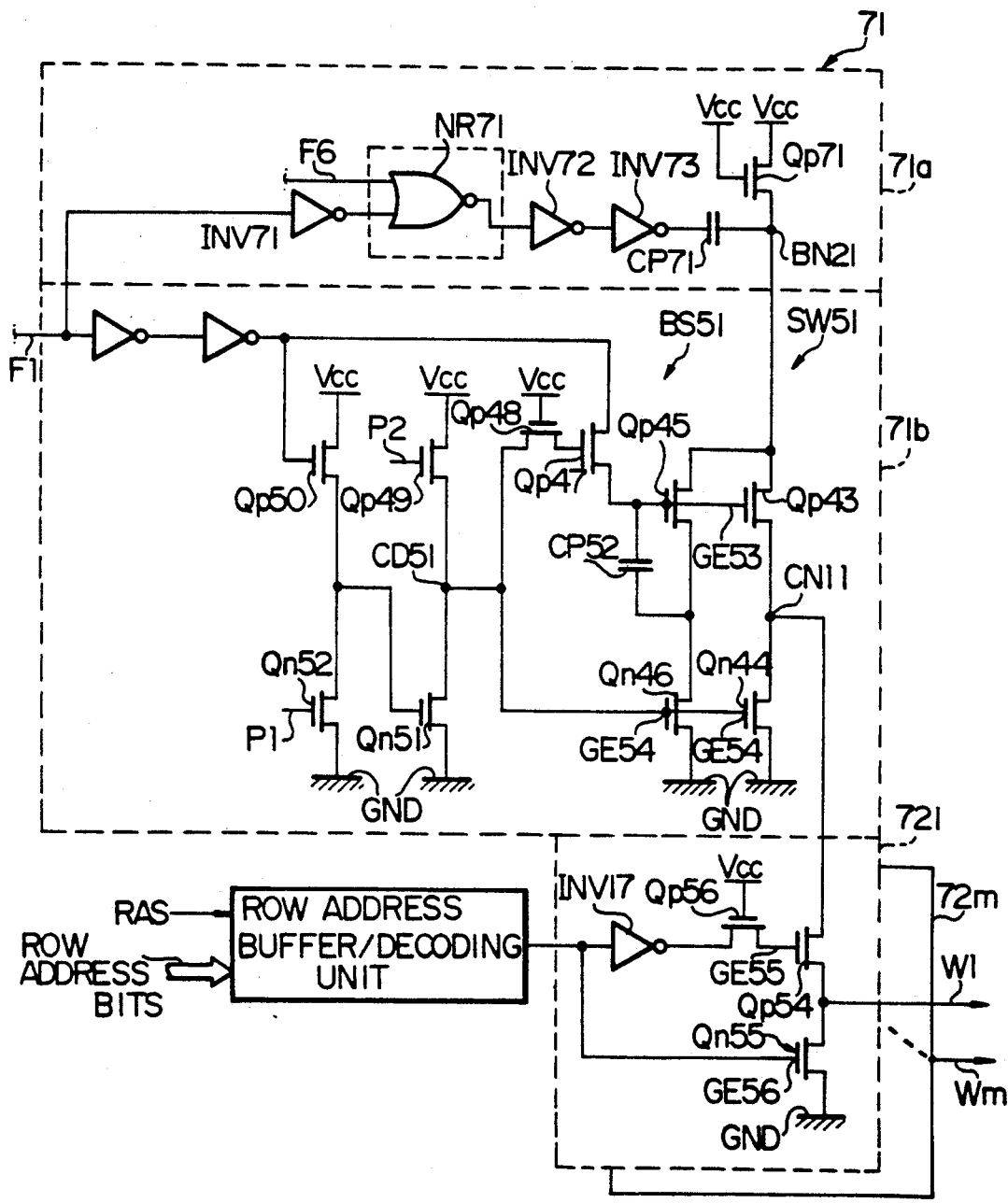
FIG. 7 is a circuit diagram showing the circuit arrangement of a word line driving unit incorporated in another random access memory device according to the present invention.

Turning to FIG. 7 of the drawings, a word line driving unit 71 incorporated in another random access memory cell device is illustrated. The word line driving unit 71 is also provided in association with a memory cell array (not shown) together with other peripheral units. However, the memory cell array and the other peripheral units are similar to those of the first embodiment, and no further description is incorporated hereinbelow. However, the memory cells and the peripheral units are designated by the same references used for the first embodiment in the following description, if necessary.

Figure 2:
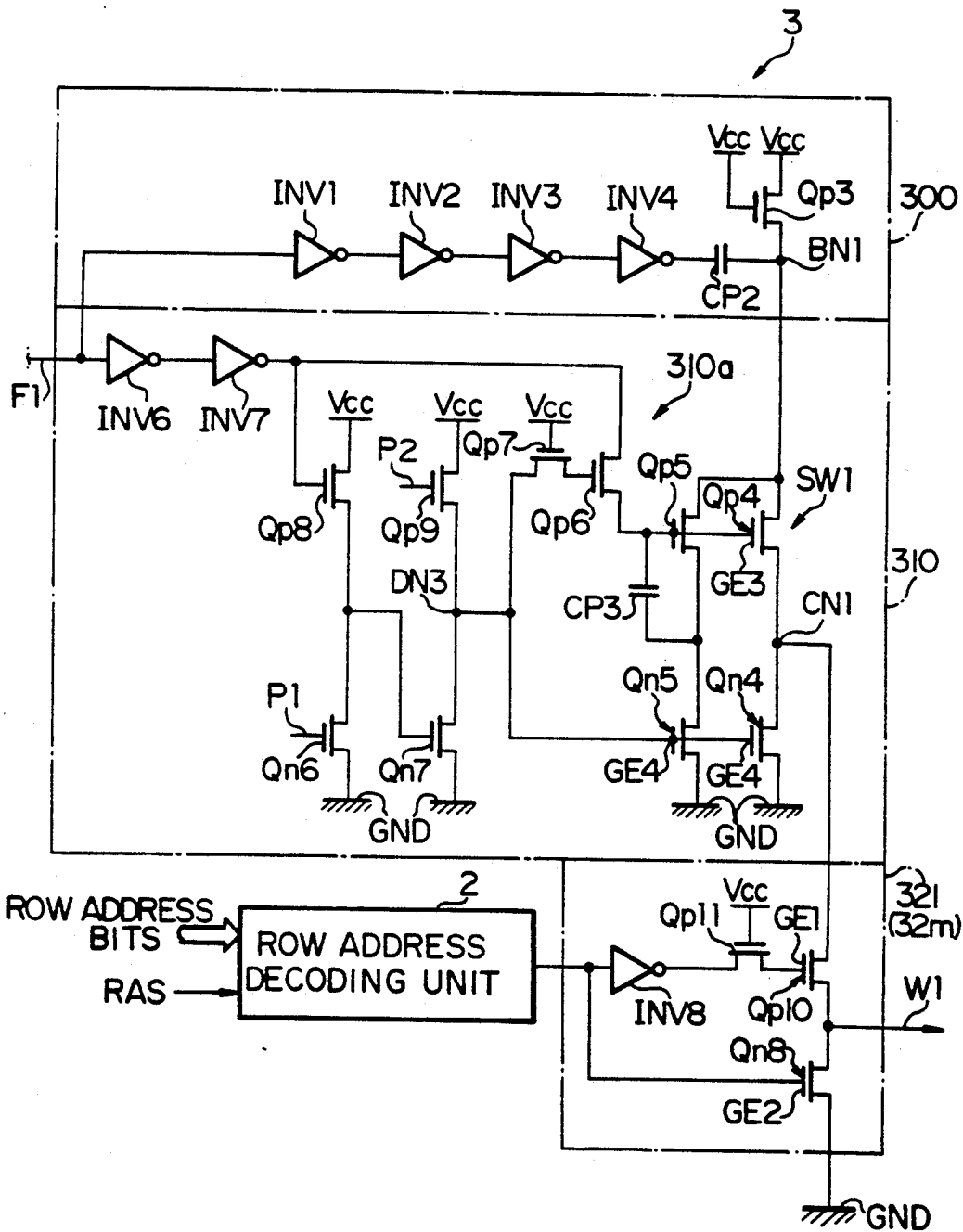
FIG. 2 is a circuit diagram showing the arrangement of a word line driving unit incorporated in the prior art random access memory device.
Figure 3:
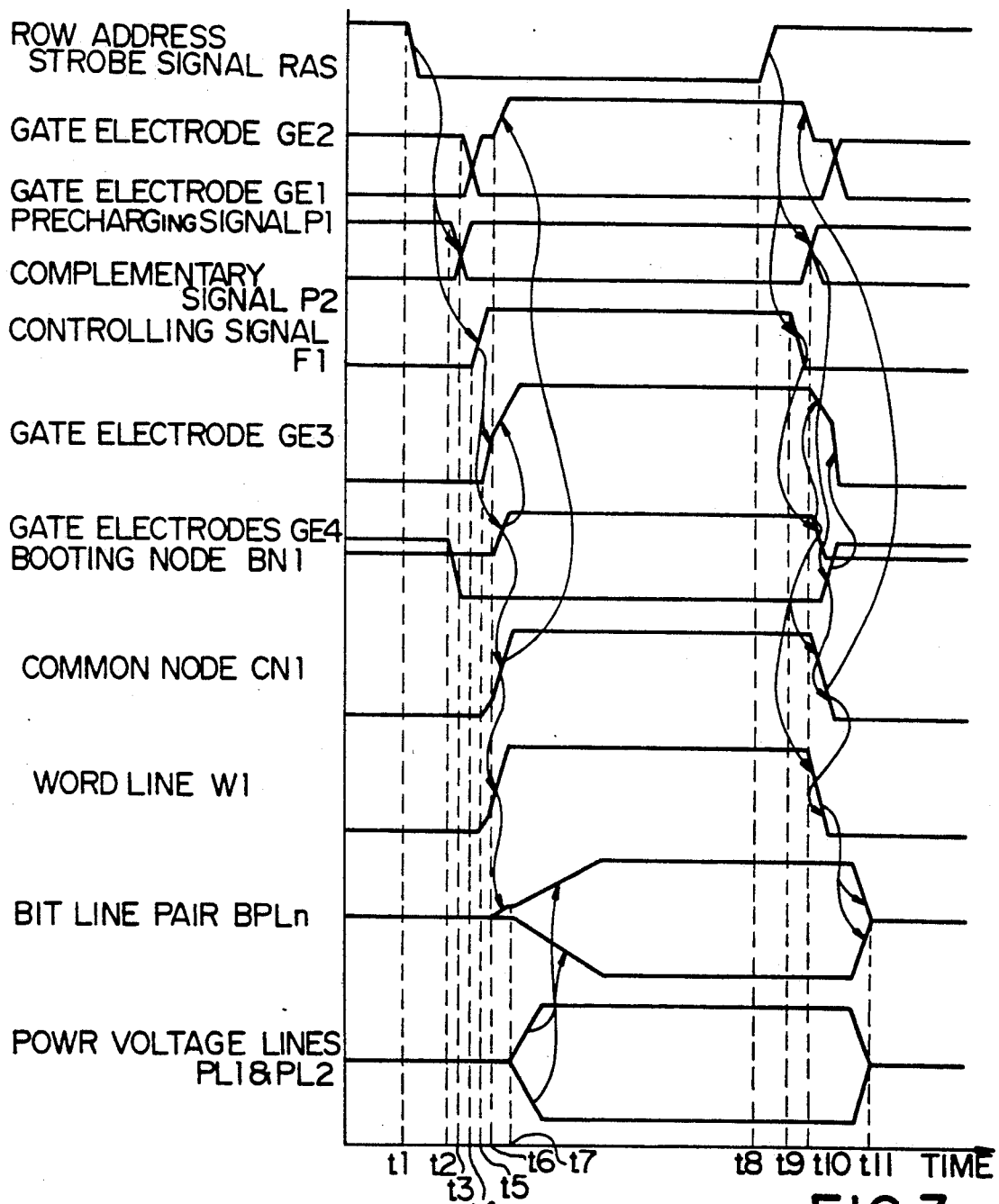
FIG. 3 is a timing chart showing the sequence of a data read-out operation of the prior art random access memory device.

The word line driving unit 71 largely comprises a bootstrapping circuit 71a, a selecting circuit 71b, and a plurality of transfer circuits 72l to 72m respectively coupled to the word lines W1 to Wm. The selecting circuit 71b and the transfer circuits 72l to 72m are similar in circuit arrangement to those of the prior art random access memory device shown in FIG. 2, and, for this reason, description is focused upon the bootstrapping circuit 71a only. However, component transistors and nodes of the selecting circuit 71b and the transfer circuits 72l to 72m are designated by the same references used for the corresponding transistors and nodes of the first embodiment.

The bootstrapping circuit 71a comprises an inverting circuit INV71 supplied with the internal controlling signal F1, a NOR gate NR71, a series combination of inverting circuits INV72 and INV73 coupled to the NOR gate NR71, a bootstrapping capacitor CP71 coupled between the inverting circuit INV73 and a booting node BN21, and a p-channel type field effect transistor coupled between the source of power voltage level Vcc and the booting node BN21. One of the input nodes of the NOR gate NR71 is coupled to the output node of the inverting circuit INV71, and an internal controlling signal F6 is supplied from the timing generating unit 53 to the other input node of the NOR gate NR71. The internal controlling signal F6 enables the NOR gate NR71 to be responsive to the output signal of the inverting circuit INV71.

Figure 8:
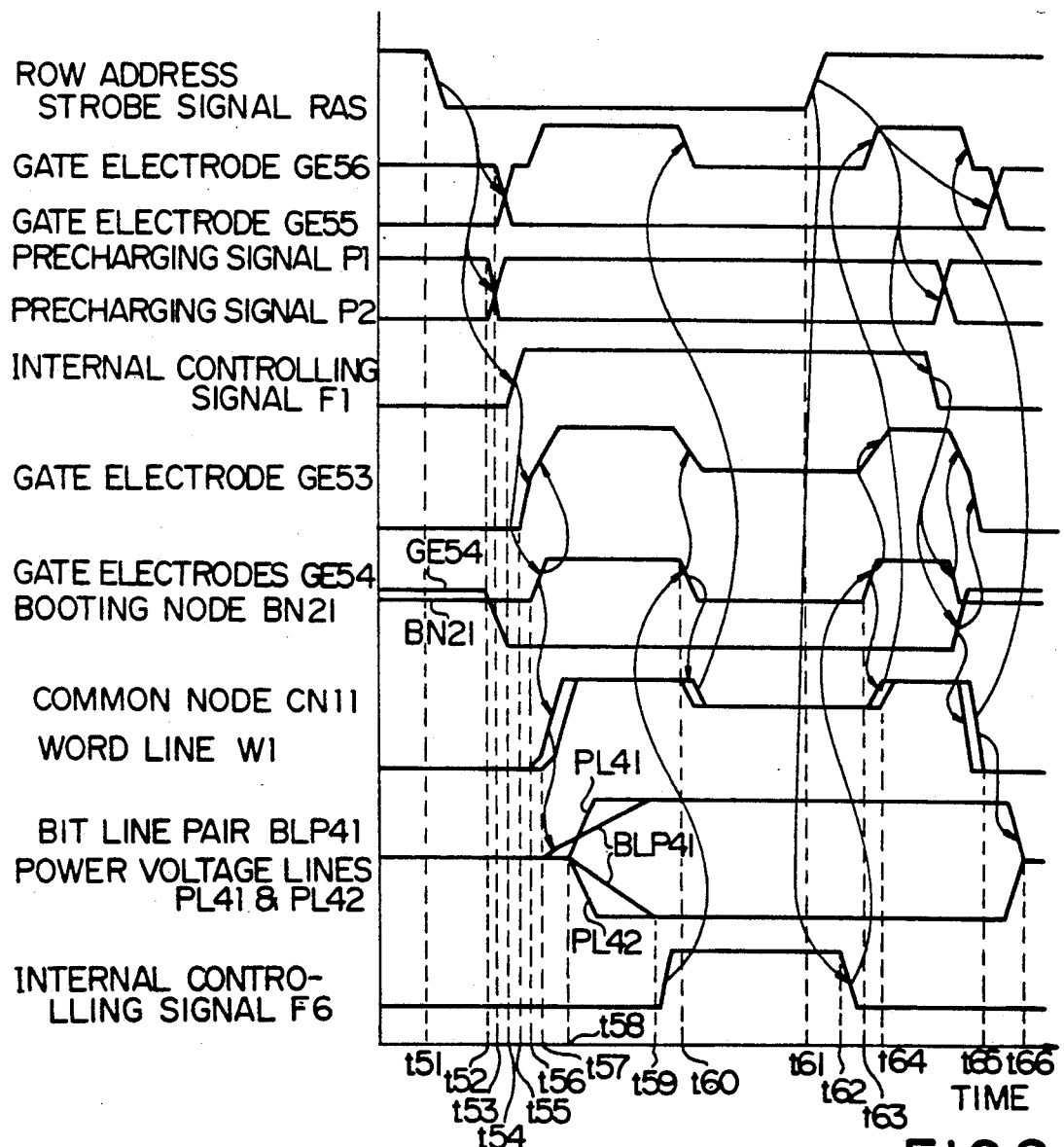
FIG. 8 is a timing chart showing the sequence of a read-out operation for the random access memory device partially shown in FIG. 7.

FIG. 8 shows a sequence of a read-out operation for the second embodiment. Assuming now that a data bit memorized in the memory cell M11 is accessed with the row and column address bits indicative of the word line W1 and the bit line pair BLP41, the row address bits are latched by the row address buffer/decoding unit 44 upon decay of the row address strobe signal RAS at time t51. The column address bits are, thereafter, latched by the column address buffer/decoding unit 51 in the presence of the column address strobe signal CAS of the active low voltage level.

The timing generating unit 53 is also responsive to the row address strobe signal RAS, and causes the precharging signal P1 to go down to the ground voltage level at time t52. The complementary precharging signal P2 concurrently goes up to the power voltage level Vcc. The n-channel type field effect transistor Qn52 turns off, and the p-channel type field effect transistor Qp49 also turns off. Since the internal controlling signal F1 remains low, the p-channel type field effect transistor Qp50 supplies the power voltage level Vcc to the gate electrode of the n-channel type field effect transistor Qn51, the n-channel type field effect transistor Qn51 turns on, and the common drain node CD51 is grounded therethrough. With the ground voltage level at the gate electrodes GE54, the n-channel type field effect transistors Qn44 and Qn46 turn off.

The row address buffer/decoding unit 44 supplies the ground voltage level to the inverting circuit INV17 and the gate electrode GE56 of the n-channel type field effect transistor Qn55 at time t53. The n-channel type field effect transistor Qn55 turns off so that the word line W1 is isolated from the ground voltage line GND. The inverting circuit INV17 allows the gate electrode GE55 to go up to the power voltage level Vcc.

The timing generating unit 53 causes the internal controlling signal F1 to go up at time t54, and the p-channel type field effect transistor Qp50 turns off. The power voltage level Vcc is supplied from the inverting circuit INV16 to the gate electrodes GE53, and the voltage level at the gate electrodes GE53 are lifted up at time t25. This means that the bootstrapping capacitor CP52 is precharged.

Since the internal controlling signal F6 remains low, the NOR gate NR71 serves as an inverting circuit, and the internal controlling signal F1 reaches the bootstrapping capacitor CP71 at time t56. The bootstrapping capacitor CP71 has been precharged through the p-channel type field effect transistor Qp71, and the bootstrapping capacitor CP71 boosts the booting node BN21 toward the first voltage level Vh1 in the presence of the internal controlling signal F1. The voltage level at the booting node BN21 is relayed through the p-channel type field effect transistors Qp43 and Qp45 to the common node CN11 as well as the bootstrapping capacitor CP52. The bootstrapping capacitor CP52 boosts the voltage level at the gate electrodes GE53, and, therefore, the p-channel type field effect transistor Qp43 propagates the first voltage level Vh1 to the common node CN11.

Upon increase of the voltage level at the common node CN11, self-bootstrapping phenomenon takes place at the gate electrode GE55, and the word line W1 is increased to the first voltage level Vh1 at time t57. The first voltage level Vh1 on the word line W1 allows the memory cells M11 to M1n to strongly turn on, and small differential voltages are produced on the bit line pairs BLP41 to BLP4n, respectively. The timing generating unit 53 provides an internal controlling signal to the sense amplifier driving unit 48, and the power voltage lines PL41 and PL42 are driven to the power voltage level Vcc and the ground voltage level, respectively, at time t58. The sense amplifier circuits SA41 to SA4n are activated with the power voltage lines PL41 and PL42, and the small differential voltage on the bit line pair BLP41 is sufficiently developed at time t59. The internal controlling signal F6 goes up to the high level immediately after time t59, and the NOR gate NR71 lowers the output signal thereof. Since the series of the inverting circuits INV72 and INV73 supplies the ground voltage level to the bootstrapping capacitor CP71, the booting node BN21 is decreased to the second voltage level Vh2 or the power voltage level at time t60, and the second voltage level Vh2 is relayed to the word line W1.

Thus, the voltage level on the word line W1 is lowered after the development of the small differential voltages on the bit line pairs BLP41 to BLP4n, and, for this reason, the gate insulating films of the n-channel type switching transistors Qn41 are less liable to be damaged.

After the development of the differential voltages on the bit line pairs BLP41 to BLP4n, the timing generating unit 53 provides the internal controlling signal to the column address buffer/decoding unit 51, and the column address buffer/decoding unit 51 instructs the column selecting unit 49 to interconnect the bit line pair BLP41 and the data line pair 50. Then, the differential voltage sufficiently developed is relayed to the input/output buffer unit 52, and an output data signal indicative of the data bit read out from the memory cell M11 is fed to the outside of the random access memory device.

Before completion of the read-out operation, the row address strobe signal RAS goes up at time t61, and the timing generating unit 53 allows the internal timing signal F6 to be recovered to the low voltage level at time t62. Since the internal controlling signal F1 remains high, the NOR gate NR71 serves as an inverting circuit again, and the inverting circuit INV73 causes the bootstrapping capacitor CP71 to boost the booting node BN21 to the third voltage level Vh3 at time t63 again. Since the third voltage level Vh3 is supplied through the p-channel type field effect transistors Qp43 and Qp45 to the common node CN11 and the bootstrapping capacitor CP52, the gate electrodes GE53 is increased in voltage level, and the third voltage level Vh3 is transferred to the common node CN11. The self-bootstrapping phenomenon takes place at the gate electrode GE55 again, and the word line W1 is boosted to the third voltage level Vh3 at time t64. The data bits read out from the memory cells M11 to M1n remain on the respective bit line pairs BLP41 to BLP4n in the form of sufficiently developed differential voltages, and are memorized in the memory cells M11 to M1n again. Since the word line W1 is in the third voltage level Vh3, the storage capacitors CP41 are charged to at least the power voltage level Vcc.

The timing generating unit 53 allows the internal controlling signal F1, the precharging signal P1 and the complementary precharging signal P2 to sequentially recover to the respective initial levels, and the word line W1 goes down to the ground voltage level at time t65. The power voltage lines PL41 and PL42 are equalized at the intermediate voltage level Vcc/2 at time t66, and the random access memory device becomes ready for the next access.

As will be understood from the foregoing description, the semiconductor memory device according to the present invention boosts a selected word line twice, and allows the selected word line to be recovered from the boosted level therebetween, and, for this reason, the switching transistors of the memory cells are less liable to be damaged.

Although particular embodiments of the present invention have been shown and described, it will be obvious to those skilled in the art that various changes and modifications may be made without departing from the spirit and scope of the present invention. For example, a random access memory device may be operative in, for example, a nibble mode, and the peripheral units are arranged in a different fashion.

What is claimed is:

1. A semiconductor memory device fabricated on a single semiconductor chip, comprising:
   a) a plurality of memory cells arranged in rows and columns and respectively storing data bits in the form of electric charges, said plurality of memory cells having switching transistors, respectively;
   b) a plurality of word lines respectively associated with said rows of said memory cells and coupled to gate electrodes of said switching transistors of the associated rows of said memory cells;
   c) a row selecting unit responsive to a row address strobe signal and operative to decode row address bits for designating one of said word lines;
   d) a plurality of bit line pairs respectively associated with the columns of said memory cells for propagating said data bits read out from said memory cells coupled to one of said word lines, the data bits being read out from said memory cells through said switching transistors for producing small differential voltages on said associated bit line pairs in said first phase, said second phase taking place after said small differential voltages are developed by sense amplifier circuits respectively coupled to said bit line pairs, said third phase taking place so as to restore said data bits on said bit line pairs to said memory cells coupled to said one of said word lines; and e) word line driving means driving said one of said word lines for allowing said data bits to be read out from said memory cells coupled to said one f said word lines through said switching transistors to said bit line pairs, said word line driving means boosting said one of said word lines to a first voltage level widely spaced from a threshold level of said switching transistors in a first phase of a readout operation, said word line driving means shifting said one of said word lines to a second voltage level closer to said threshold level than said first voltage level in a second phase following said first phase, said word line driving means boosting said one of said word lines to a third voltage level widely spaced from said threshold level rather than said second voltage level in a third phase following said second phase, said word line driving means comprising e-1) a main bootstrapping circuit for producing said first voltage level, e-2) a selecting circuit selectively coupling a common node to said main bootstrapping circuit and a source of low voltage level, e-3) a plurality of transferring circuits respectively coupled to said word lines and selectively coupled to said common node under the control of said row selecting unit, e-4) a discharging circuit for discharging said common node from said first voltage level to said second voltage level, and e-5) an auxiliary bootstrapping circuit for boosting said common node from said second voltage level to said third voltage level.

2. A semiconductor memory device as set forth in claim 1, in which said main bootstrapping circuit comprises a first precharging transistor coupled between a source of power voltage level and a booting node for precharging said booting node, a delay circuit supplied with a first internal controlling signal indicative of a bootstrapping operation, and a first bootstrapping capacitor coupled between said delay circuit and said booting node, said booting node being coupled to said selecting circuit.

3. A semiconductor memory device as set forth in claim 2, in which said selecting circuit has a first transistor coupled between said booting node and said common node, and a bootstrapping circuit supplied with a voltage level at said booting node and boosting a voltage level at a gate electrode of said first transistor.

4. A semiconductor memory device as set forth in claim 1, in which each of said transferring circuits comprises a series combination of a second transistor and a third transistor coupled between said common node and a source of low voltage level, an inverting circuit coupled to said row selecting unit, and a second precharging transistor coupled between said inverting circuit and a gate electrode of said second transistor for precharging the gate electrode of said second transistor, a gate electrode of said third transistor being directly coupled to said row selecting unit, said second and third transistors being opposite in channel conductivity type to each other, said associated word line being coupled to a common drain node of said second and third transistors, self-bootstrapping phenomenon taking place at the gate electrode of said second transistor for propagating said first and third voltage levels to said associated word line.

5. A semiconductor memory device as set forth in claim 2, in which said discharging circuit comprises a fourth transistor coupled between said common node and said source of power voltage level for supplying a high voltage level, a third precharging transistor for precharging a gate electrode of said fourth transistor with a second internal controlling signal indicative of a bootstrapping operation, and a second bootstrapping capacitor supplied with said second internal controlling signal for bootstrapping the gate electrode of said fourth transistor.

6. A semiconductor memory device as set forth in claim 1, in which said auxiliary bootstrapping circuit comprises a fifth transistor coupled between said common node and another booting node, a fourth precharging transistor coupled between said source of power voltage level for producing a high voltage level and said another booting node for precharging said another booting node, a fifth precharging transistor coupled to the gate electrode of said fifth transistor for precharging a gate electrode of said fifth transistor with a third internal controlling signal indicative of a bootstrapping operation, and a third bootstrapping capacitor coupled to said another booting node for boosting said another booting node with said third bootstrapping capacitor.

7. A semiconductor memory device fabricated on a single semiconductor chip, comprising:
a) a plurality of memory cells arranged in rows and columns and respectively storing data bits in the form of electric charges, said plurality of memory cells having switching transistors, respectively;
b) a plurality of word lines respectively associated with said rows of said memory cells and coupled to gate electrodes of said switching transistors of the associated rows of said memory cells;
c) a row selecting unit responsive to a row address strobe signal and operative to decode row address bits for designating one of said word lines;
d) a plurality of bit line pairs respectively associated with the columns of said memory cells for propagating said data bits read out from said memory cells coupled to one of said word lines, the data bits being read out from said memory cells through said switching transistors for producing small differential voltages on said associated bit line pairs in said first phase, said second phase taking place after said small differential voltages are developed by sense amplifier circuits respectively coupled to said bit line pairs, said third phase taking place so as to restore said data bits on said bit line pairs to said memory cells coupled to said one of said word lines; and
e) word line driving means driving said one of said word lines for allowing said data bits to be read out from said memory cells coupled to said one f said word lines through said switching transistors to said bit line pairs, said word line driving means boosting said one of said word lines to a first voltage level widely spaced from a threshold level of said switching transistors in a first phase of a readout operation, said word line driving means shifting said one of said word lines to a second voltage level closer to said threshold level than said first voltage level in a second phase following said first phase, said word line driving means boosting said one of said word lines to a third voltage level widely spaced from said threshold level rather than said second voltage level in a third phase following said second phase, said word line driving means comprising e-1) a bootstrapping circuit for sequentially producing said first, second and third voltage levels, e-2) a selecting circuit selectively coupling a common node to said bootstrapping circuit and a source of low voltage level, e-3) a plurality of transferring circuits respectively coupled to said word lines and selectively coupled to said common node under the control of said row selecting unit.

8. A semiconductor memory device as set forth in claim 7, in which said bootstrapping circuit comprises a first precharging transistor coupled between a source of power voltage level and a booting node for precharging said booting node, an inverting circuit supplied with a first internal controlling signal, a NOR gate coupled to said inverting circuit and enabled in the presence of a second internal controlling signal for controlling a bootstrapping operation, a series combination of inverting circuits coupled to an output node of said NOR gate, and a first bootstrapping capacitor coupled between the series combination of inverting circuits and said booting node, said second internal controlling signal being shifted to an active level in said first and third phases for causing said first bootstrapping capacitor to boost said booting node, said second internal controlling signal remaining in an inactive level in said second phase for canceling said bootstrapping operation in said first phase.

* * * * *

UNITED STATES PATENT AND TRADEMARK OFFICE
CERTIFICATE OF CORRECTION

PATENT NO. : 5,287,325
DATED : February 15, 1994
INVENTOR(S) : Yasukazu MORITA

It is certified that error appears in the above-indentified patent and that said Letters Patent is hereby corrected as shown below:

Col. 2, line 9, delete "301" and insert --301--.

Col. 3, line 5, delete "321" and insert --321--;

Col. 3, line 6, delete "321" and insert --321--.

Col. 7, line 56, delete "451" and insert --451--.

Col. 8, line 66, delete "451" and insert --451--;

Col. 8, line 67, delete "451" and insert --451--.

Col. 12, line 1, delete "721" and insert --721--;

Col. 12, line 3, delete "721" and insert --721--;

UNITED STATES PATENT AND TRADEMARK OFFICE
CERTIFICATE OF CORRECTION

PATENT NO. : 5,287,325
DATED : February 15, 1994
INVENTOR(S) : Yasukazu MORITA

It is certified that error appears in the above-indentified patent and that said Letters Patent is hereby corrected as shown below:

Col. 12, line 9, delete "721" and insert --721--.

Col. 15, line 6, delete "f" and insert --of--.

Col. 16, line 55 delete "f" and insert --of--.

Signed and Sealed this

Thirteenth Day of September, 1994

Attest:

BRUCE LEHMAN

Attesting Officer     Commissioner of Patents and Trademarks